United States Patent
Lloyd

[11] 3,936,346
[45] Feb. 3, 1976

[54] CRYSTAL GROWTH COMBINING FLOAT ZONE TECHNIQUE WITH THE WATER COOLED RF CONTAINER METHOD

[75] Inventor: William W. Lloyd, Richardson, Tex.

[73] Assignee: Texas Instruments Incorporated, Dallas, Tex.

[22] Filed: Dec. 26, 1973

[21] Appl. No.: 428,266

[52] U.S. Cl. .............................. 156/620; 23/273 SP
[51] Int. Cl.² ........................................... B01J 17/10
[58] Field of Search ................. 23/301 SP, 273 SP; 156/608, 620, 618, 619

[56] References Cited
UNITED STATES PATENTS

| | | | |
|---|---|---|---|
| 2,686,864 | 8/1954 | Wroughton et al. | 23/273 SP |
| 2,876,147 | 3/1959 | Kniepkamp et al. | 23/273 SP |
| 2,985,519 | 5/1961 | Kelemen | 23/273 SP |

*Primary Examiner*—Jack Sofer
*Assistant Examiner*—Frank Sever
*Attorney, Agent, or Firm*—Harold Levine; James T. Comfort; Gary C. Honeycutt

[57] ABSTRACT

The disclosure relates to the growth of single crystal material from polycrystalline material by combining the pedestal and cold crucible techniques to yield a method of producing large, high purity single crystals on a commercial scale. The method includes feeding a bar of polycrystalline material, such as silicon, into a cold cage which can be a cold silver crucible or the like having an aperture in the bottom thereof to permit insertion of the polycrystalline feed bar. An RF coil surrounds the cold cage and melts the silicon as it reaches into the cage, the RF coil providing a temperature to the silicon material which is slightly above the melting point thereof. A rod of single crystal material, the same as the feed bar, is positioned in the melt from the top surface of the cold cage and acts as a seed crystal. The single crystal rod is then pulled upwardly from the cage while polycrystalline silicon is fed into the cage through the aperture in the bottom thereof. By continuously forcing the polycrystalline rod into the cage and pulling a rod at the top of the cage, a large single crystal can be grown while maintaining only a small melt volume. The diameter of the single crystal rod being pulled will have a relation to the upper diameter of the cold cage as well as the ratio of the feed rate of the polycrystalline bar relative to the pull rate of the single crystalline bar.

7 Claims, 1 Drawing Figure

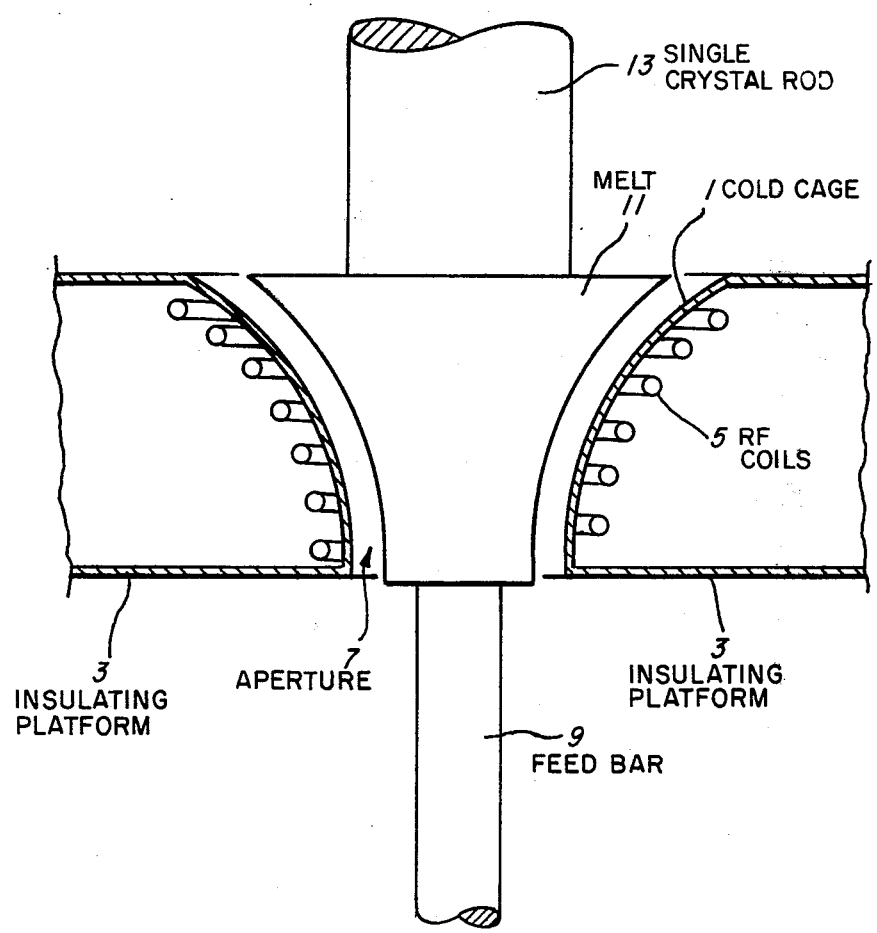

CRYSTAL GROWTH COMBINING FLOAT ZONE TECHNIQUE WITH THE WATER COOLED RF CONTAINER METHOD

This invention relates to the formation of single crystal rods of material capable of electrical conduction in the region of their melting temperature and, more specifically, to the growth of such rods by combining the pedestal and cold crucible techniques of crystal rod formation to provide large, high purity single crystals on a substantially continuous commercial scale.

Several prior art methods are known for producing single crystal material, particularly single crystal semiconductor material such as silicon, germanium and the like from polycrystalline materials. One such prior art method is known as the Pedestal technique and is a technique wherein a large diameter bar of polycrystalline material is placed in the field of an RF coil which induces melting. A seed of single crystal of the same material is dipped into the melt formed until fusion occurs and then the seed is slowly withdrawn. In this way, the feed bar which is polycrystalline is converted to a single crystal bar. Disadvantages of this method are in obtaining optimum conditions for melting and supporting the melt that will also support the growth of the full diameter crystal. A further disadvantage is the high degree of skill required of the crystal grower. In addition, these disadvantages increase significantly as the crystal diameter increases.

A second well-known method of crystal growth is the cold crucible growth method. In accordance with this method, a cold crucible, which is essentially an array of conducting tubes with water passing through them, forms the secondary of an RF transformer. The spacing between each tube is sufficiently small such that the surface tension of the molten material prevents the material falling through. The tube array is also designed such that the RF currents flowing in it support rather than cancel each other. A simple example of such an arrangement is a silver boat used in conjunction with silicon. A silver tube of about 3 inches diameter has a trough indented into it. The silver tube acts as the secondary of an RF transformer made up of the silver tube itself and an RF coil fed by an induction heater operating at a frequency in the range of 0.5 to 10 MHz. Induced currents set up in the tube induce currents in the silicon. The geometry is such that these currents support each other and melting occurs. Further, the two sets of induced currents give rise to mechanical forces that raise the molted silicon above the silver. This significantly reduces contamination by the silver. There are many geometrical arrangements that can be made using the above-noted principles. For example, a single crystal seed may be dipped into the molten material to grow a single crystal by, essentially, the Czochralski technique. The disadvantage of the cold crucible for single crystal growth is that only a small volume of material can be melted and subsequently only small experimental crystals can be grown.

In accordance with the present invention, there is provided a method of forming single crystal semiconductor rods, such as silicon rods, which overcome the disadvantages of the above described prior art techniques and result in a combination of the Pedestal and Cold Crucible Techniques to yield a method of producing high purity single crystals on a commercial scale. Briefly, the above is accomplished by providing a feed bar of polycrystalline material. In the present discussion, reference will be made to silicon though it should be understood that other appropriate materials such as germanium and the like which can form single crystals and which can conduct electric current in the vicinity of their melting temperature can be used. The polycrystalline silicon feed bar is passed into a cold cage which is preferably formed of silver though it can be formed with any electrically conducting material. The cold cage has an aperture at the bottom thereof through which the polycrystalline silicon feed bar is fed. An RF coil surrounds the cold cage and melts the silicon in the region within the cage, the silicon essentially taking the shape of the cage but not quite touching the edges thereof. A single crystal silicon seed is placed into the molten silicon and, when fusion takes place, the seed is pulled upwardly from the molten silicon mass within the cold cage while polycrystalline silicon is being fed in through the aperture at the bottom. In this way, polycrystalline silicon is converted to single crystalline silicon. The diameter of the single crystal silicon rod pulled in this manner is dependent in part upon the diameter of the cold cage upper portion as well as the ratio of the feed rates between the insertion of a polycrystalline material into the cold cage and the extraction of the single crystal silicon from the top of the cold cage. It is apparent that if the polycrystalline material is fed at a faster rate than the single crystalline material is being pulled, the diameter of the single crystal rod will be increased. Conversely, if the reverse ratio is provided, the diameter of the single crystal rod will be decreased.

The above-described technique provides the advantages of maintaining a low-oxygen low-carbon content associated with pedestal growth; avoidance of balancing a large melt; large diameter pedestal crystal growth; feed bar dimensions are not nearly so critical; operator techniques are substantially reduced; and effective heat shielding of the reactor components is obtained.

It is therefore an object of this invention to provide a method of forming large single crystal semiconductor rods of a higher quality than is obtainable by prior art techniques.

It is a further object of this invention to provide a method of forming monocrystalline semiconductor rods that can be formed at relatively lower cost than by prior art techniques.

It is a yet further object of this invention to provide a method for forming monocrystalline semiconductor rods having increased rod diameter capability relative to prior art methods.

It is a still further object of this invention to provide a substantially continuous method of converting polycrystalline semiconductor rods to single crystal semiconductor rods.

It is a further object of this invention to provide a method for forming single crystal semiconductor rods which combines the pedestal and cold crucible techniques of the prior arts to provide a method of producing relatively larger, higher purity single crystal semiconductor rods on a commercial scale relative to prior art methods.

The above objects and still further objects of the invention will immediately become apparent to those skilled in the art after consideration of the following preferred embodiment thereof, which is provided by way of example and not by way of limitation wherein:

The FIGURE is a schematic diagram for apparatus for performing the method in accordance with the present invention.

Referring now to the FIGURE, there is shown a cross-section of a cold cage 1 which is resting on an electrically insulating platform 3. The cold cage is preferably formed from silver or other electrically conducting material of very high purity. A set of RF coils 5 surrounds the cold cage and induces current in the cold cage in well-known manner. The cold cage is essentially a cold crucible and includes an aperture 7 at the bottom thereof to permit insertion of a rod 9 of polycrystalline material which is to be melted within the cold cage 1. The polycrystalline rod can be silicon, germanium or any other material which is capable of conducting current at temperatures in the vicinity of its melting point. The polycrystalline feed bar 9 which, for the sake of the preferred embodiment herein will be described with reference to silicon, is inserted into the aperture 7 of the cold cage 1, and, upon entering the cold cage 1 is heated up due to the heat produced by the RF coils 5 which induce currents in the cold cage 1, this current then being transferred to the silicon material within the cold cage. This heat forces the silicon to melt and the molten silicon is shown within the cold cage by the reference 11. The silicon 11 does not come in contact with the surfaces of the cold cage 1, there being a slight gap as shown in the FIGURE. A single crystal silicon seed is then positioned in the upper surface of the molten silicon 11 and, when fusion takes place, the single crystal is pulled upwardly to form a single crystal silicon rod 13 in well known manner. The rod 13 can continue to be pulled upwardly solong as there is molten silicon within the cold cage 1. This molten silicon is provided by continually feeding polycrystalline silicon via the polycrystalline feed bar 9 through the aperture 7. It can therefore be seen that a continuous process is provided for converting polycrystalline silicon or other semiconductor material into monocrystalline rods.

The advantages of this technique over prior art techniques is quite apparent in that there is a maintenance of low-oxygen and low-carbon content which is associated with the pedestal growth technique. There is also no necessity of balancing a large melt. Furthermore, large diameter pedestal crystals can be grown by this method. This is apparent from the fact that the diameter of the single crystal rod 13 is determined by the ratio of the feed rate of the polycrystalline feed bar 9 relative to the pull rate of the monocrystalline rod 13. As the feed rate of the feed bar 9 is increased relative to the pull rate of the single crystal bar 13, the diameter of the rod 13 will increase, the converse also being true.

It can be seen that the diameter of the rod 13 will be limited by the diameter of the upper surface of the cold cage 1.

It is apparent that, in accordance with the present method, the dimensions of the feed bar 9 are not very critical and need only be somewhere in the vicinity of and slightly less than the diameter of the aperture 7. Furthermore, operator skills of high degree are not required to operate in accordance with the above-described method. In addition, effective heat shielding of the reactor components is easily provided.

Though the invention has been described with respect to a specific preferred embodiment thereof, many variations and modifications will immediately become apparent to those skilled in the art. It is therefore the intention that appended claims be interpretated as broadly as possible in view of the prior art to include all such variations and modifications.

What is claimed is:

1. A method of forming single crystal material from polycrystalline material which comprises the steps of
    a. Providing an electrically conducting cold cage container having top and bottom apertures surrounded by RF coils,
    b. feeding a rod of polycrystalline material into said bottom aperture,
    c. inducing an electrical current in said container and said material to melt and levitate said material within said container, and to maintain said material free of said container,
    d. placing a seed crystal in said metl to initiate crystal growth, and
    e. continuing the crystal growth by pulling said seed away from said melt at a controlled rate while maintaining levitation of said melt.

2. A method as set forth in claim 1 wherein the rate of feed of said rod in step (b) and the rate of pulling said seed in step (e) are predetermined and relatively independent.

3. A method as set forth in claim 1 wherein said rod is silicon and said seed is silicon.

4. A method as set forth in claim 2 wherein said rod is silicon and said seed is silicon.

5. A method as set forth in claim 4 wherein said container is silver.

6. A method as set forth in claim 4 wherein said electrical current is induced by an RF coil surrounding said container.

7. A method as set forth in claim 5 wherein said electrical current is induced by an RF coil surrounding said container.

* * * * *